United States Patent
Son et al.

(10) Patent No.: US 12,119,370 B2
(45) Date of Patent: Oct. 15, 2024

(54) MICRO LED DISPLAY INCLUDING ANTISTATIC GROUND CIRCUIT BOARD

(71) Applicant: Samsung Electronics Co., Ltd., Suwon-si (KR)

(72) Inventors: Seongho Son, Suwon-si (KR); Jongsung Lee, Suwon-si (KR); Changjoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 421 days.

(21) Appl. No.: 17/535,800

(22) Filed: Nov. 26, 2021

(65) Prior Publication Data

US 2022/0085099 A1     Mar. 17, 2022

Related U.S. Application Data (63) Continuation of application No. PCT/KR2020/007016, filed on May 29, 2020.

(30) Foreign Application Priority Data

May 31, 2019   (KR) ........................ 10-2019-0064694

(51) Int. Cl.
 *H01L 27/02*   (2006.01)
 *H01L 27/15*   (2006.01)
 *H05K 9/00*   (2006.01)

(52) U.S. Cl.
 CPC ........ *H01L 27/156* (2013.01); *H01L 27/0248* (2013.01); *H05K 9/0054* (2013.01); *H05K 9/0067* (2013.01)

(58) Field of Classification Search
None
See application file for complete search history.

(56) References Cited

U.S. PATENT DOCUMENTS 7,859,633 B2    12/2010 Park
2012/0319932 A1  12/2012 Li et al.
(Continued)

FOREIGN PATENT DOCUMENTS

CN    2414585 Y    1/2001
CN    101118327 A    2/2008
(Continued)

OTHER PUBLICATIONS

European Search Report dated Jul. 5, 2022, issued in European Application No. 20814800.7.
(Continued)

*Primary Examiner* — Sarah K Salerno
(74) *Attorney, Agent, or Firm* — Jefferson IP Law, LLP (57) ABSTRACT

An antistatic ground circuit board and a micro light emitting diode (LED) display including same are provided. The display includes a substrate comprising a first surface oriented toward a first direction, a second surface oriented toward a second direction opposite the first direction, and a side surface oriented toward a third direction perpendicular to the first and second directions, a first circuit unit disposed on the first surface, a second circuit unit disposed on the second surface, a side circuit unit disposed on the side surface and electrically connected to the first circuit unit, a plurality of micro LED chips arranged on one surface of the first circuit unit oriented toward the first direction, and a ground circuit board disposed on the second surface to ground static electricity generated in one or more circuit units from among the first circuit unit, the second circuit unit, and the side circuit unit.

14 Claims, 6 Drawing Sheets

(56) References Cited

U.S. PATENT DOCUMENTS

| | | |
|---|---|---|
| 2014/0321011 A1 | 10/2014 | Bisson et al. |
| 2015/0169011 A1 | 6/2015 | Bibl et al. |
| 2015/0194109 A1 | 7/2015 | Fujikawa |
| 2016/0210895 A1 | 7/2016 | Fan et al. |
| 2016/0320681 A1 | 11/2016 | Kim et al. |
| 2017/0064826 A1 | 3/2017 | Park et al. |
| 2018/0190632 A1 | 7/2018 | Bibl et al. |
| 2021/0065618 A1 | 3/2021 | Cao et al. |

FOREIGN PATENT DOCUMENTS

| | | |
|---|---|---|
| CN | 101647326 A | 2/2010 |
| CN | 104362142 A | 2/2015 |
| CN | 109461386 A | 3/2019 |
| KR | 10-0795076 B1 | 1/2008 |
| KR | 10-2008-0049885 A | 6/2008 |
| KR | 10-2010-0109802 A | 10/2010 |
| KR | 10-2016-0128666 A | 11/2016 |
| KR | 10-2016-0129946 A | 11/2016 |
| KR | 10-2017-0013460 A | 2/2017 |
| KR | 10-2017-0025963 A | 3/2017 |
| KR | 10-1820258 B1 | 1/2018 |

OTHER PUBLICATIONS

Korean Office Action with English translation dated Jan. 29, 2024; Korean Appln. No. 10-2019-0064694.
Chinese Office Action with English translation dated Dec. 8, 2023; Chinese Appln. No. 202080040262.4.
Chinese Office Action with English translation dated Apr. 29, 2024; Chinese Appln. No. 202080040262.4.

MICRO LED DISPLAY INCLUDING ANTISTATIC GROUND CIRCUIT BOARD

CROSS-REFERENCE TO RELATED APPLICATION(S)

This application is a continuation application, claiming priority under § 365(c), of an International application No. PCT/KR2020/007016, filed on May 29, 2020, which is based on and claims the benefit of a Korean patent application number 10-2019-0064694, filed on May 31, 2019, in the Korean Intellectual Property Office, the disclosure of which is incorporated by reference herein in its entirety.

TECHNICAL FIELD

The disclosure relates to an antistatic ground structure of a micro light emitting diode (LED) display.

BACKGROUND ART

A micro LED display seeks to be a bezel-less display or a modular display, and a wiring formation structure using a conductive layer directly attached to a side surface of a substrate may be unavoidable.

During production of a display such as a liquid crystal display (LCD) or organic light emitting diodes (OLED), temperature/humidity and foreign materials may be sufficiently controlled without exposure of wires and pads, and it may be possible to minimize damage by static elasticity because thin film transistor (TFT) circuit portions are handled in an unmanned environment.

In addition, since the display is positioned on the outermost side of the TFT circuit, it may be possible to reduce damage by static elasticity by disconnecting electrically connected wires in a state in which all wires are electrically connected, and in a state in which potential damage by static electricity is minimized.

The above information is presented as background information only to assist with an understanding of the disclosure. No determination has been made, and no assertion is made, as to whether any of the above might be applicable as prior art with regard to the disclosure

DISCLOSURE OF INVENTION

Technical Problem

However, in connection with a micro LED display wiring structure in which wires need to be formed on side surfaces of the substrate, the assembly process cannot proceed easily if all wires remains connected in the process of forming wires on side surfaces of the substrate, and no technology has been secured to disconnect wires to the final state without damaging the substrate.

Therefore, micro LED displays are exposed to potential point/line/surface defects due to static elasticity, because processes need to proceed while connection pads on the upper surface of the substrate and wires on the side surfaces thereof are exposed.

Therefore, there may be a need for a ground structure for protecting circuit parts from static elasticity in order to secure product completeness of micro LED displays and mass production thereof.

Aspects of the disclosure are to address at least the above-mentioned problems and/or disadvantages and to provide at least the advantages described below. Accordingly, an aspect of the disclosure is to provide a ground connecting circuit capable of protecting damage to an inner multiplexer/demultiplexer (MUX/DEMUX) circuit and/or an integrated circuit (IC) of a driver unit from generated static elasticity, and a micro LED display including the same.

Another aspect of the disclosure is to provide a ground connecting circuit capable of protecting circuit parts of a circuit board from static elasticity not only in a set assembly state, but also when the product is delivered or used after the assembly is completed.

Additional aspects will be set forth in part in the description which follows and, in part, will be apparent from the description, or may be learned by practice of the presented embodiments.

Solution to Problem

In accordance with an aspect of the disclosure, a micro LED display is provided. The micro LED display includes a substrate including a first surface disposed to face in a first direction, a second surface disposed to face in a second direction opposite to the first direction, and a side surface disposed to face in a third direction perpendicular to the first and the second direction, a first circuit unit disposed on the first surface, a second circuit unit disposed on the second surface, a side circuit unit disposed on the side surface and electrically connected in parallel to the first circuit unit, multiple micro LED chips arranged on a surface of the first circuit unit facing in the first direction, and a ground circuit board disposed on the second surface and configured to ground static electricity having been generated in one or more circuit units from among the first circuit unit, the second circuit unit, or the side circuit unit, wherein the ground circuit board is electrically connected to the side circuit unit, is disposed on the periphery of the second circuit unit, and is configured to ground the generated static electricity.

Advantageous Effects of Invention

The disclosure may protect the multiplexer (MUX) circuit of the first circuit unit or the driver integrated circuit (IC) of the second circuit unit from static elasticity.

The disclosure may protect the MUX/DEMUX circuit of the first circuit unit or the driver IC of the second circuit unit from static elasticity even after assembly of the micro LED display is completed, or when the micro LED display is delivered in a product state.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For example, an electronic device according to various embodiment of the disclosure may include at least one of a smartphone, a tablet personal computer (PC), a mobile phone, a video phone, an electronic book (e-book) reader, a desktop personal computer (PC), a laptop personal computer (PC), a netbook computer, a workstation, a server, a personal digital assistant (PDA), a portable multimedia player (PMP), an moving picture experts group (MPEG) audio layer 3 (MP3) player, a mobile medical appliance, a camera, or a wearable device (e.g., a smart glasses, a head-mounted-device (HMD), electronic clothes, an electronic bracelet, an electronic necklace, an electronic appcessory, electronic tattoos, a smart mirror, or a smart watch).

In some embodiments, the electronic device may be a smart home appliance. The smart home appliance may include at least one of, for example, a television, a digital video disk (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., an Xbox™ and a PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, a scanner, an ultrasonic machine, etc.), a navigation device, a global positioning system (GPS) receiver, an event data recorder (EDR), a flight data recorder (FDR), a vehicle infotainment device, an electronic devices for a ship (e.g., a navigation device for a ship, a gyro-compass, etc.), avionics, a security device, an automotive head unit, a robot for home or industry, an automatic teller's machine (ATM) in banks, point of sales (POS) in a shop, or an internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, or various kinds of measuring instruments (e.g., a water meter, an electric meter, a gas meter, and a radio wave meter, etc.). In various embodiments, an electronic device may be a combination of one or more of the aforementioned various devices. An electronic device according to some embodiments may be a flexible electronic device. Further, an electronic device according to an embodiment of the disclosure may not be limited to the aforementioned devices, and may include a new electronic device according to the development of technology.

Figure 1:
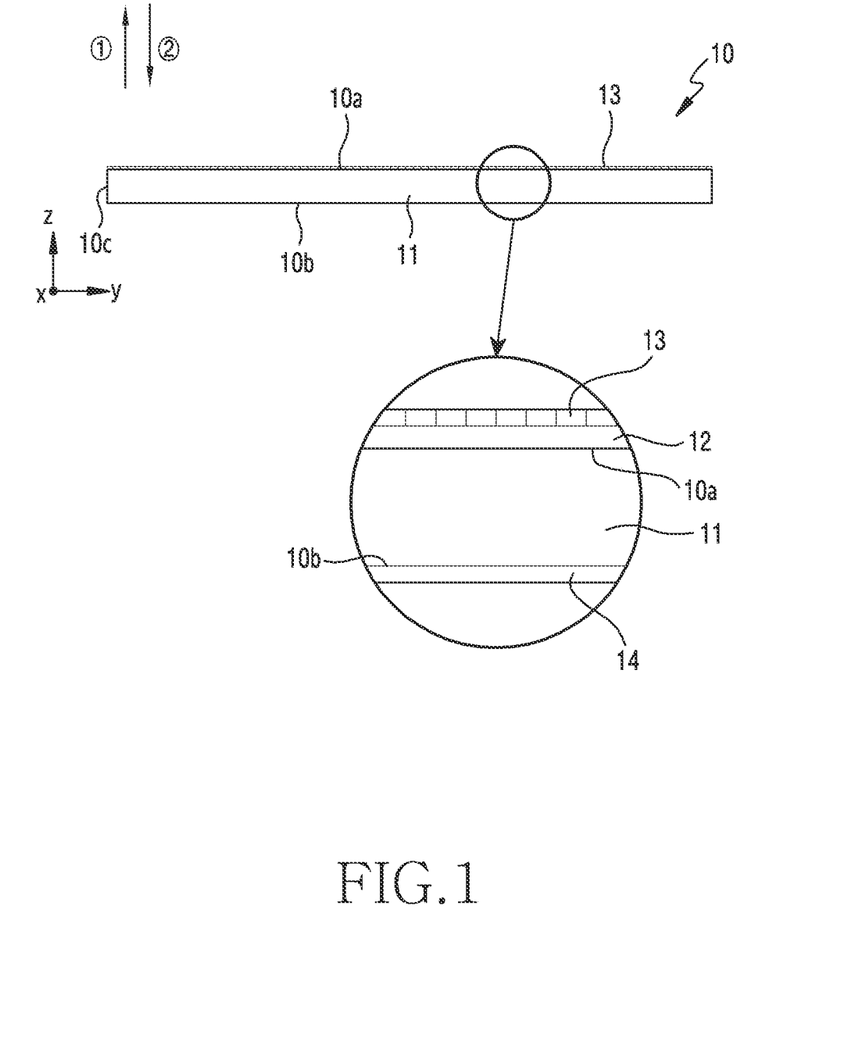
FIG. 1 is a side view illustrating a structure of a micro LED display which is an enlarged view of a portion thereof according to an embodiment of the disclosure.

FIG. 1 is a side view illustrating a micro LED display 10 which is an enlarged view of a portion thereof according to an embodiment of the disclosure.

In a rectangular coordinate system used therein, the X axis may be a transverse direction of a micro LED display 10, the Y axis may be a longitudinal direction of the micro LED display 10, and the Z axis may be a thickness direction of a micro LED display 10. The illustrated micro LED display 10 may be utilized in a small display, and multiple micro LED displays 10 may be combined to be utilized as a large screen display. For example, the micro LED display 10 according to one embodiment may be utilized in one of a display of an electronic device, a TV screen, a theater movie screen, or an electronic display board.

Referring to FIG. 1, the micro LED display 10 according to one embodiment may be utilized as a display of an electronic device. The micro LED display 10 according to one embodiment may include a substrate 11, a first circuit unit 12 and a second circuit unit 14, and multiple micro LED chips 13. According to one embodiment, the substrate 11 may be made of a glass material and may be a support plate for supporting, in a plate form, the multiple arranged micro LED chips 13. According to one embodiment, the substrate 11 may include a first surface 10a, the second surface 10b, and the third surface 10c. For example, the first surface 10a may be a front surface, the second surface 10b may be a rear surface, and the third surface 10c may be four side surfaces. According to one embodiment, the multiple micro LED chips 13 may be arranged on the first circuit unit 12 and may emit light to implement a display area.

According to one embodiment, the multiple micro LED chips 13 may be arranged on one surface of the first circuit unit 12 facing in a first direction ① in a connection pad-down state. For example, each of the micro LED chips 13 may have a size of 100 micrometers or less, and may have a size of about tens of micrometers. Each of the micro LED chips 13 may include a red color element, a green color element, and a blue color element.

Figure 2:
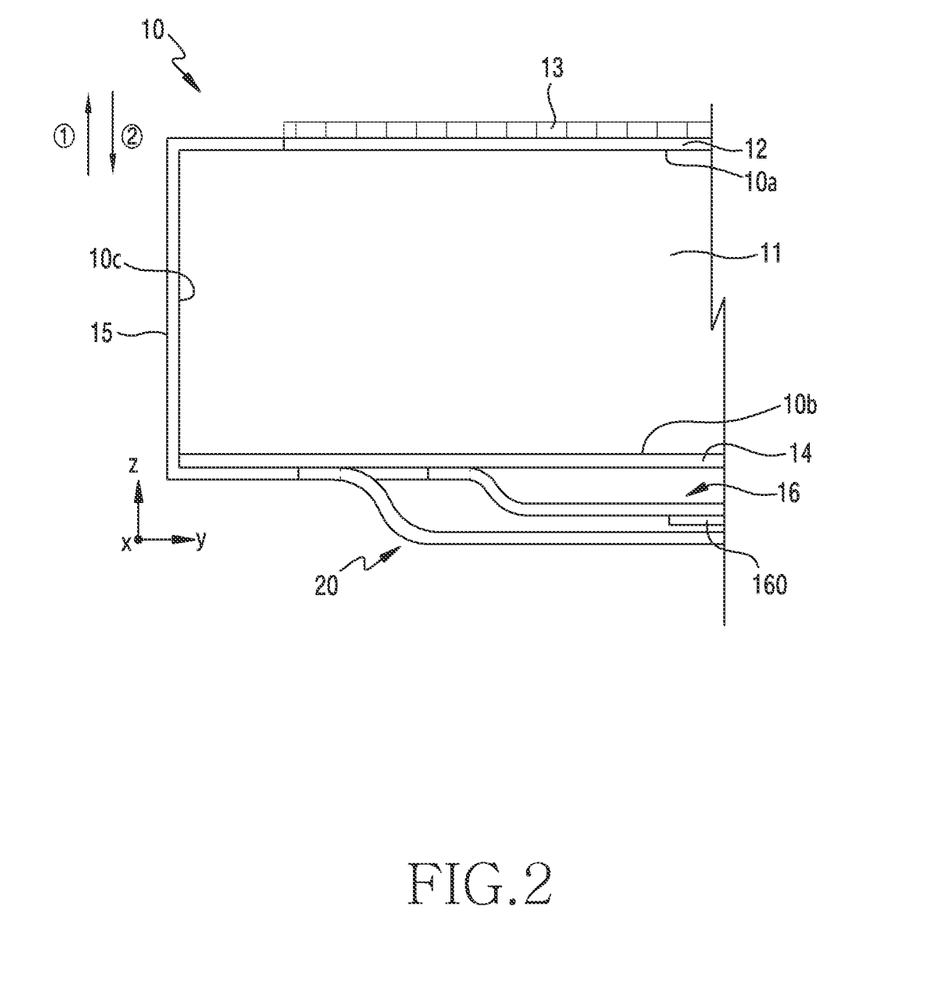
FIGS. 2 and 3 are side views illustrating a ground structure arranged on a micro LED display, respectively, according to various embodiment of the disclosure.
Figure 3:
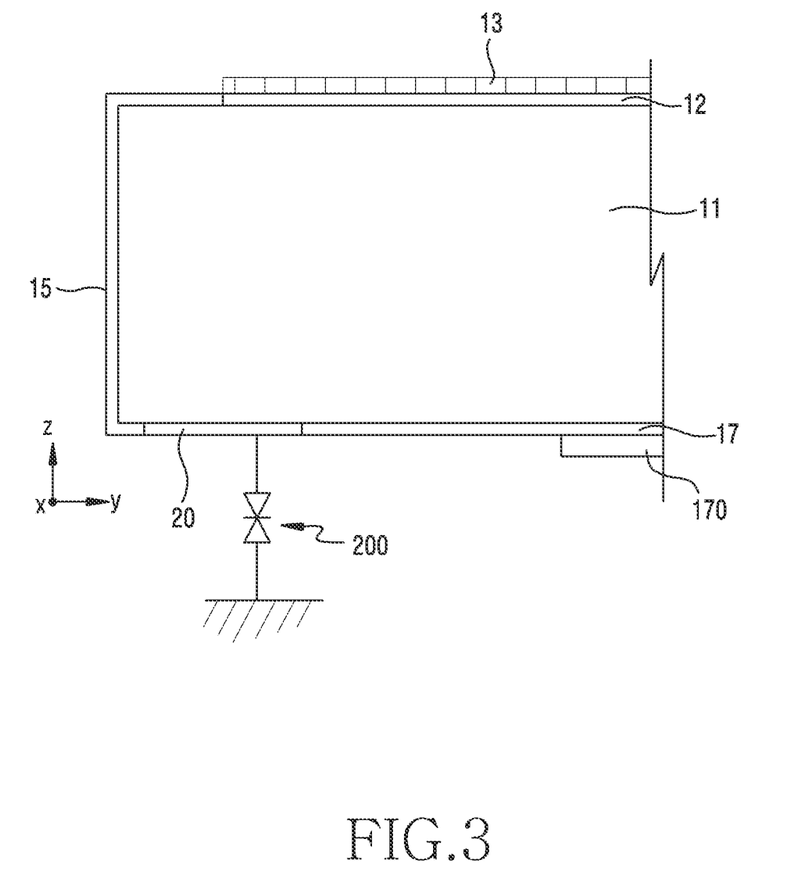

FIGS. 2 and 3 are side views illustrating a ground structure arranged on a micro LED display 10, respectively, according to various embodiments of the disclosure.

Referring to FIG. 2, a substrate 11 may include a first surface 10a facing in a first direction ①, the second surface 10b facing in a second direction ② opposite to the first direction ①, and a side surface 10c which is perpendicular to the first and the second direction ① and ② and is configured to surround at least a part of a space between the first surface 10a and the second surface 10b. According to one embodiment, the substrate 11 may include a first circuit unit 12 disposed on the first surface 10a, a second circuit unit 14 disposed on the second surface 10b, and a side circuit unit 15 disposed on the third surface 10c.

According to one embodiment, the first circuit unit 12 may be disposed on the first surface 10a and may have multiple micro LED chips 13 arranged thereon. For example, the first circuit unit 12 may include a TFT circuit. The first circuit unit 12 may be formed by a conductive line patterned on the first surface 10a. According to one embodiment, the first circuit unit 12 may include a multiplexer (MUX)/demultiplexer (DEMUX) circuit. According to one embodiment, the first circuit unit 12 may be entirely formed on the first surface.

According to one embodiment, the second circuit unit 14 may be disposed on the second surface 10b. According to one embodiment, the second circuit unit 14 may be partially formed on the second surface 10b. The second circuit unit 14 may include an additional circuit unit 16 having a driver IC 160 disposed thereon. According to one embodiment, the additional circuit unit 16 may be a flexible circuit board type and may be electrically connected to the second circuit unit 14. For example, the additional circuit unit 16 may have the driver IC 160 disposed on one surface thereof.

Referring to FIG. 3, a circuit unit 17 on which a driver IC 170 is disposed may be formed by a conductive material directly patterned on a second surface 10b of a substrate. That is, the circuit unit 17 may be included in the second circuit unit 14.

Referring to FIG. 2, the side circuit unit 15 may be disposed on one surface 10c of the four surfaces, may be electrically connected to the first circuit unit 12, and may be electrically connected to a ground structure 20. For example, the ground structure 20 may be formed in a flexible circuit board type and, hereinafter, may be referred to as a ground circuit board.

According to one embodiment, the side circuit unit 15 may be formed by a conductive line which is patterned on an edge area of the first surface 10a of the substrate 11, the side surface 10c, and an edge area of the second surface 10b, or may be formed by using a separate flexible circuit board.

According to one embodiment, in a case where static electricity is applied to the side circuit unit 15, the MUX/DEMUX circuit of the first circuit unit 12 or the driver IC 160 of the circuit unit 16 may be damaged by the applied static electricity, but the applied static electricity may be grounded by the ground circuit board 20. Therefore, by adding a static electricity induction path by using the ground circuit board 20, the MUX/DEMUX circuit or the driver IC 160, for example, may be protected. According to one embodiment, the ground circuit board 20 may be located on an intermediate path between the MUX/DEMUX circuit and the driver IC so as to prevent the generated static electricity from flowing to the MUX/DEMUX circuit or the driver IC.

According to one embodiment, the side circuit unit 15 may be electrically connected to the first circuit unit 12 and may be electrically to the second circuit unit 14. According to one embodiment, the first circuit unit 12 may not be electrically connected to the second circuit unit 14. According to one embodiment, the side circuit unit 15 may not be electrically connected to the second circuit unit 14.

Figure 4:
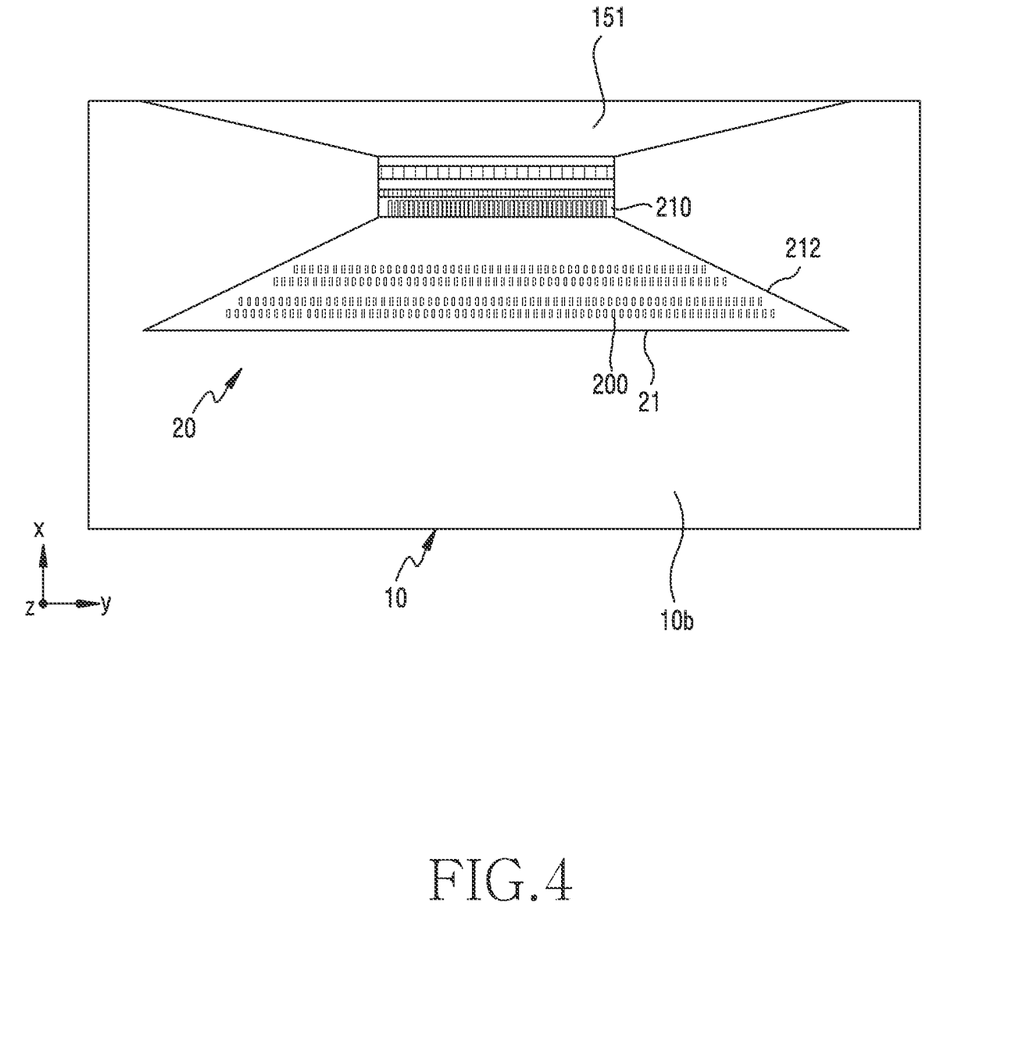
FIG. 4 is a plan view illustrating a ground structure disposed on a second surface of a substrate according to an embodiment of the disclosure.

FIG. 4 is a plan view illustrating a ground circuit board disposed on a second surface of a substrate 11 according to an embodiment of the disclosure. FIG. 4 illustrates only a signal layer 21 of a ground circuit board 20.

Referring to FIG. 4, a ground circuit board may be disposed on a second surface 10b of a substrate 11. According to one embodiment, the ground circuit board 20 may include a signal layer 21.

According to one embodiment, the signal layer 21 may include a first portion 210 connected to the side circuit unit 15 and a second portion 212 on which multiple antistatic protection elements 200 are arranged. According to one embodiment, the second portion 212 may be a trapezoid shape or an isosceles trapezoid shape. However, the second portion 212 may not be limited to such the shape and may be formed in various shapes.

Figure 5:
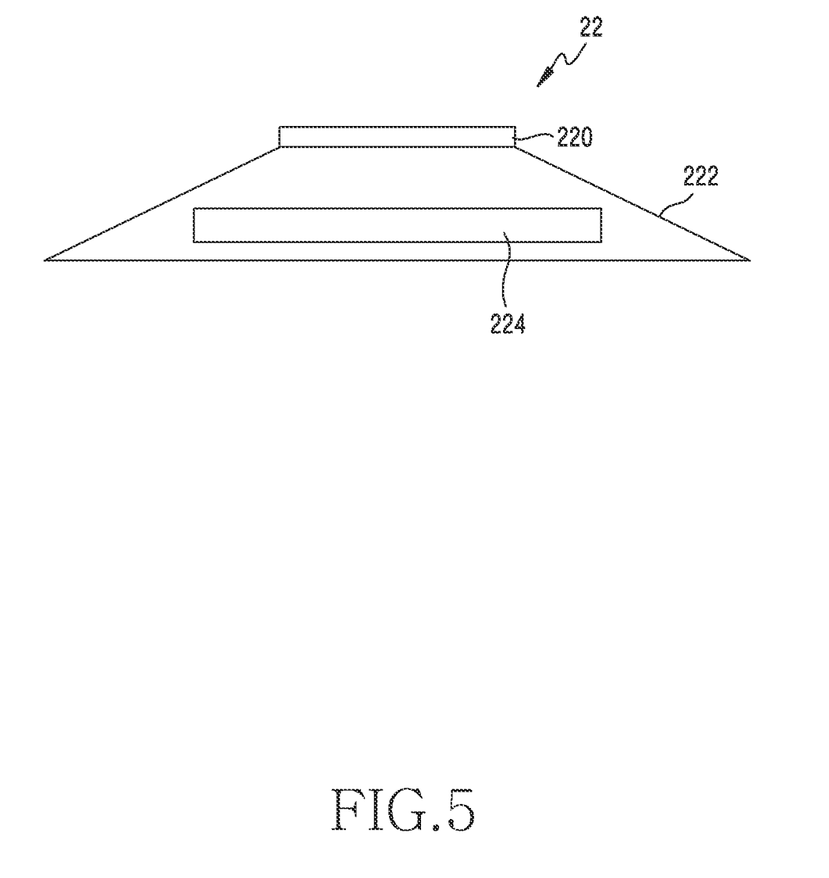
FIG. 5 is a plan view illustrating another ground layer according to an embodiment of the disclosure.

FIG. 5 is a plan view illustrating another ground layer 22 according to an embodiment of the disclosure.

Referring to FIG. 5, a ground layer 22 according to one embodiment may include a first portion 220 electrically connected to a portion of a side circuit unit (e.g., the edge portion 151 of the side circuit unit illustrated in FIG. 4) and a second portion 222 on which a ground connection pad 224 is disposed. According to one embodiment, the second portion 222 may be a trapezoid shape or an isosceles trapezoid shape and may have a shape corresponding to a second portion (e.g., the second portion 212 illustrated in FIG. 4) of a signal layer 21. According to one embodiment, the ground connection pad 224 may be disposed in a shape extending along an edge of the second portion 222. For example, the ground connection pad 224 may have a shape linearly extending in one direction.

Figure 6:
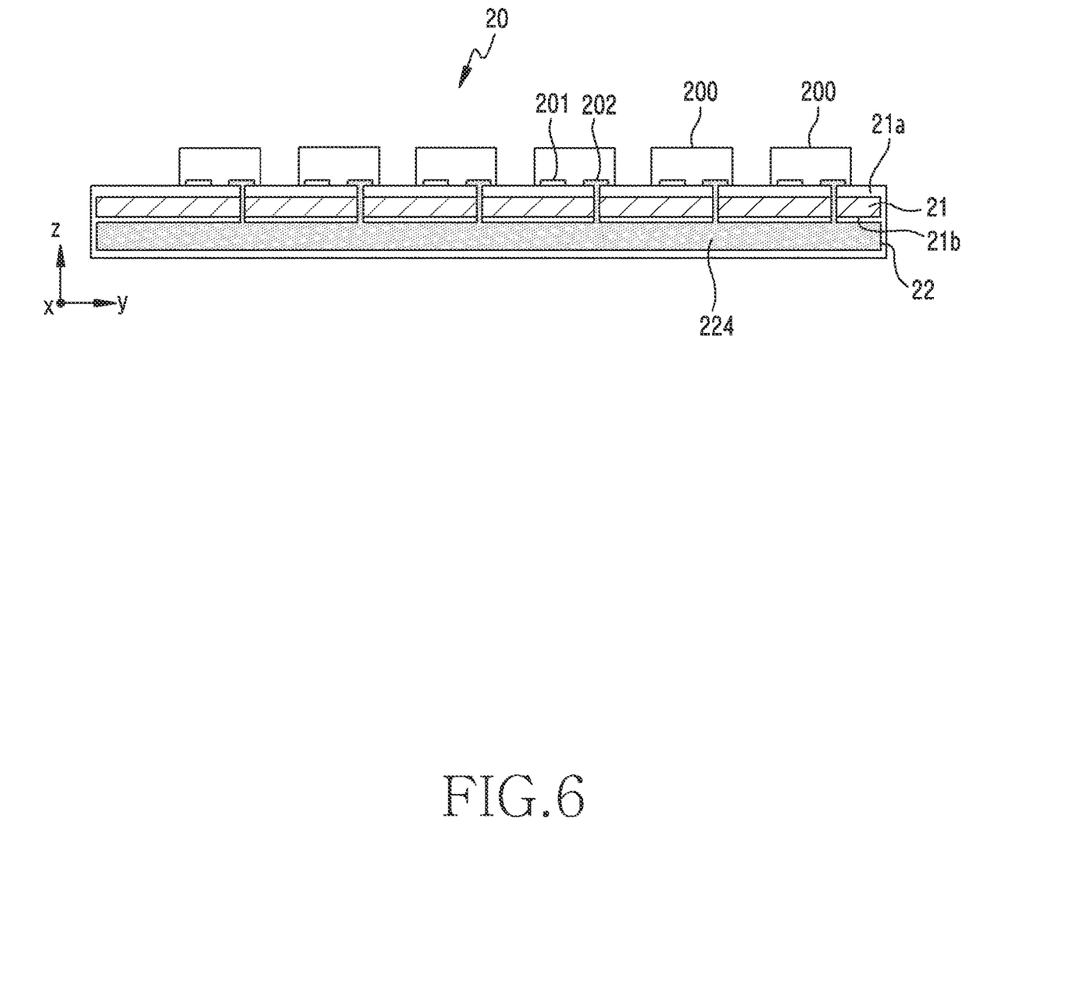
FIG. 6 is a cross-sectional view illustrating a ground connection circuit according to an embodiment of the disclosure.

FIG. 6 is a cross-sectional view illustrating a ground circuit board 20 according to an embodiment of the disclosure.

Referring to FIG. 6, a ground circuit board 20 may be a structure configured to ground static electricity having been generated in one or more circuit units among circuit units arranged on a substrate, for example, a first circuit unit (e.g., the first circuit unit 12 illustrated in FIG. 1), a second circuit unit (e.g., the second circuit unit 14 illustrated in FIG. 2), or the side circuit unit 15. According to one embodiment, the ground circuit board 20 may be made of a flexible material and may be disposed on the periphery of the second circuit unit 14. According to one embodiment, the ground circuit board 20 may be disposed on the side circuit unit 15 and a circuit board (e.g., the circuit unit 16 illustrated in FIG. 2) on which a driver IC is disposed. For example, the ground circuit board 20 may be made of a flexible material.

According to one embodiment, the ground circuit board 20 may include a signal layer 21 and a ground layer 22. According to one embodiment, the signal layer 21 may include a first surface 21a and a second surface 21b opposite to the first surface 21a. According to one embodiment, the signal layer 21 may have multiple antistatic protection elements 200 arranged on the first surface 21a. Each of the antistatic protection elements 200 may be mounted on the first surface 21a of the signal layer 21 in a connection pad-down type. According to one embodiment, the antistatic protection elements 200 may be mounted on the signal layer 21 by a film on glass (FOG) method. For example, the antistatic protection elements 200 each may include a transient voltage suppressor (TVS) diode.

According to one embodiment, the ground layer 22 may be attached to the signal layer 21 and may be electrically connected to the antistatic protection elements 200. The ground layer 22 may be arranged in at least one layer. According to one embodiment, each of the antistatic protection elements 200 may be electrically connected to a ground connection pad 224.

According to one embodiment, each of the antistatic protection elements 200 may include a first connection pad 201 and a second connection pad 202. According to one embodiment, the first connection pad 201 may be electrically connected to the signal layer 21 and the second connection pad 202 may be electrically connected to the ground connection pad 224 disposed on the ground layer 22. According to one embodiment, the signal layer 21 may be made of a flexible material. According to one embodiment, the ground layer 22 may be made of a flexible material.

According to one embodiment, a micro LED display may include: a substrate including a first surface disposed to face in a first direction, a second surface disposed to face in a second direction opposite to the first direction, and a side surface disposed to face in a third direction perpendicular to the first and the second direction; a first circuit unit disposed on the first surface; a second circuit unit disposed on the second surface; a side circuit unit disposed on the side surface and electrically connected to the first circuit unit; multiple micro LED chips arranged on a surface of the first circuit unit facing in the first direction; and a ground circuit board configured to ground static electricity having been generated in one or more circuit units from among the first circuit unit, the second circuit unit, or the side circuit unit, wherein the ground circuit board may be electrically connected to the side circuit unit, may be disposed on the periphery of the second circuit unit, and may be configured to ground the generated static electricity.

According to one embodiment, the ground circuit board may be disposed between the side circuit unit and the second circuit unit.

According to one embodiment, the ground circuit board may include a flexible material.

According to one embodiment, the ground circuit board may include: a signal layer having multiple antistatic protection elements arranged on a surface thereof; and an at least one layer of a ground layer attached to the signal layer and electrically connected to the antistatic protection elements.

According to one embodiment, each of the antistatic protection elements may include a first and a second connection pad, wherein the first connection pad may be electrically connected to the signal layer, and the second connection pad may be electrically connected to the ground layer.

According to one embodiment, the ground layer may include a ground connection pad, and the second connection pad may be electrically connected to the ground connection pad.

According to one embodiment, the antistatic protection elements each may include a TVS diode.

According to one embodiment, the signal layer may include a flexible material.

According to one embodiment, the ground layer may include a flexible material.

According to one embodiment, the multiple antistatic protection elements may be mounted on the signal layer by using a FOG method.

According to one embodiment, the signal layer on which the multiple antistatic protection elements are arranged may have an isosceles trapezoid shape.

According to one embodiment, a portion of the ground layer on which the ground connection pad is disposed may have an isosceles trapezoid shape.

According to one embodiment, the substrate may include a glass material.

According to one embodiment, the second circuit unit may be formed by a conductive material patterned onto the second surface of the substrate or may be connected to the second surface.

According to one embodiment, the first circuit unit may include a (MUX/DEMUX) circuit, the second circuit unit may include a driver IC, and the ground circuit board may be disposed on an intermediate path between the MUX/DEMUX circuit and the driver IC.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A micro light emitting diode (LED) display comprising:
a substrate comprising:
a first face disposed to face in a first direction,
a second face disposed to face in a second direction opposite to the first direction, and
a side face disposed to face in a third direction perpendicular to the first direction and the second direction;
a first circuit disposed on the first face;
a second circuit disposed on the second face;
a side circuit disposed on the side face and electrically connected in parallel to the first circuit;
multiple micro LED chips arranged on a face of the first circuit facing in the first direction; and
a ground circuit board disposed on the second face and configured to ground static electricity having been generated in one or more circuits from among the first circuit, the second circuit, or the side circuit,
wherein the ground circuit board is disposed between the second circuit and the side circuit,
wherein the ground circuit board comprises:
a signal layer electrically coupled to the side circuit, and
a ground layer attached to a first face of the signal layer, and
wherein the ground layer is electrically connected, through the signal layer, to at least one antistatic protection element arranged on a second face of the signal layer opposite to the first face of the signal layer.

2. The micro LED display of claim 1, wherein the ground circuit board is disposed between the side circuit and the second circuit.

3. The micro LED display of claim 1, wherein the ground circuit board comprises a flexible material.

4. The micro LED display of claim 1,
wherein the at least one antistatic protection element comprises a first connection pad and a second connection pad,
wherein the first connection pad is electrically connected to the signal layer, and
wherein the second connection pad is electrically connected to the ground layer.

5. The micro LED display of claim 4,
wherein the ground layer comprises a ground connection pad, and
wherein the second connection pad is electrically connected to the ground connection pad.

6. The micro LED display of claim 5, wherein a portion of the ground layer on which the ground connection pad is disposed has an isosceles trapezoid shape.

7. The micro LED display of claim 1, wherein the at least one antistatic protection element comprises a transient voltage suppressor (TVS) diode.

8. The micro LED display of claim 1, wherein the signal layer comprises a flexible material.

9. The micro LED display of claim 1, wherein the ground layer comprises a flexible material.

10. The micro LED display of claim 1, wherein the at least one antistatic protection element is mounted on the signal layer by using a film on glass (FOG) method.

11. The micro LED display of claim 1, wherein the signal layer on which the at least one antistatic protection element is arranged in an isosceles trapezoid shape.

12. The micro LED display of claim 1, wherein the substrate comprises a glass material.

13. The micro LED display of claim 1, wherein the second circuit is formed by a conductive material patterned onto the second face of the substrate or is a flexible circuit board connected to the second face.

14. The micro LED display of claim 1,
wherein the first circuit comprises a multiplexer/demultiplexer (MUX/DEMUX) circuit,
wherein the second circuit comprises a driver integrated circuit (IC), and
wherein the ground circuit board is disposed on an intermediate path between the MUX/DEMUX circuit and the driver IC.

* * * * *